United States Patent [19]

Itagaki

[11] Patent Number: 5,045,777
[45] Date of Patent: Sep. 3, 1991

[54] ELECTRIC SIGNAL PRODUCING SYSTEM

[75] Inventor: Hidenobu Itagaki, Amagasaki, Japan

[73] Assignee: Mitsubishi Denki K.K., Tokyo, Japan

[21] Appl. No.: 343,307

[22] Filed: Apr. 26, 1989

[30] Foreign Application Priority Data

Apr. 26, 1988 [JP] Japan .................. 63-101394
Sep. 13, 1988 [JP] Japan .................. 63-227624

[51] Int. Cl.$^5$ .................. G01R 23/16; G01V 3/00; H03M 1/12
[52] U.S. Cl. .................. 324/77 R; 324/307; 341/155
[58] Field of Search ............ 324/77 R, 312, 307, 324/309; 341/155, 157, 169, 131

[56] References Cited

U.S. PATENT DOCUMENTS

| | | | |
|---|---|---|---|
| 3,656,152 | 4/1972 | Gundersen | 341/131 |
| 4,187,466 | 2/1980 | Kasson et al. | 341/131 |
| 4,691,162 | 9/1987 | Van Uijen | 324/309 |
| 4,710,747 | 12/1987 | Holland | 341/155 |
| 4,725,814 | 2/1988 | Pohl | 341/131 |
| 4,740,748 | 4/1988 | Rzedzian | 324/309 |
| 4,761,634 | 8/1988 | Yamaguchi et al. | 341/155 |
| 4,812,846 | 3/1989 | Noro | 341/131 |
| 4,876,544 | 10/1989 | Kuraishi | 341/155 |

OTHER PUBLICATIONS

Journal of Magnetic Resonance, 69, 504-507, 1986, "Improvement of DynamicRange by Oversampling" by Delsuc et al.
Electronic Product Design, Mar., 1987, pp. 59-62, "Oversampling to Increase S/N of ADC's" by Tiefenhaler.
Society of Magnetic Resonance in Medicine, 7th Annual Meeting Abstracts, p. 978, "A Method for the Reduction of ADC Quantization Noise" by Itagaki.

Primary Examiner—Hezron E. Williams
Assistant Examiner—Louis M. Arana
Attorney, Agent, or Firm—Sughrue, Mion, Zinn, Macpeak & Seas

[57] ABSTRACT

An electric signal producing system according to the present invention comprises known signal generating means for generating a known signal having a predetermined frequency, adding means for adding the known signal to a reception signal to generate a mixture signal, an A/D converter for converting the mixture signal to digital data, and a computer for controlling the A/D converter to oversample the mixture signal by a frequency of twice or more as large as a predetermined sampling frequency and calculating in accordance with the digital data.

6 Claims, 13 Drawing Sheets

ELECTRIC SIGNAL PRODUCING SYSTEM

BACKGROUND OF THE INVENTION

The present invention relates to an electric signal producing system for producing various types of information by sampling a received signal and, more particularly, to an electric signal producing system in which its resolution and accuracy are improved.

Figure 10:
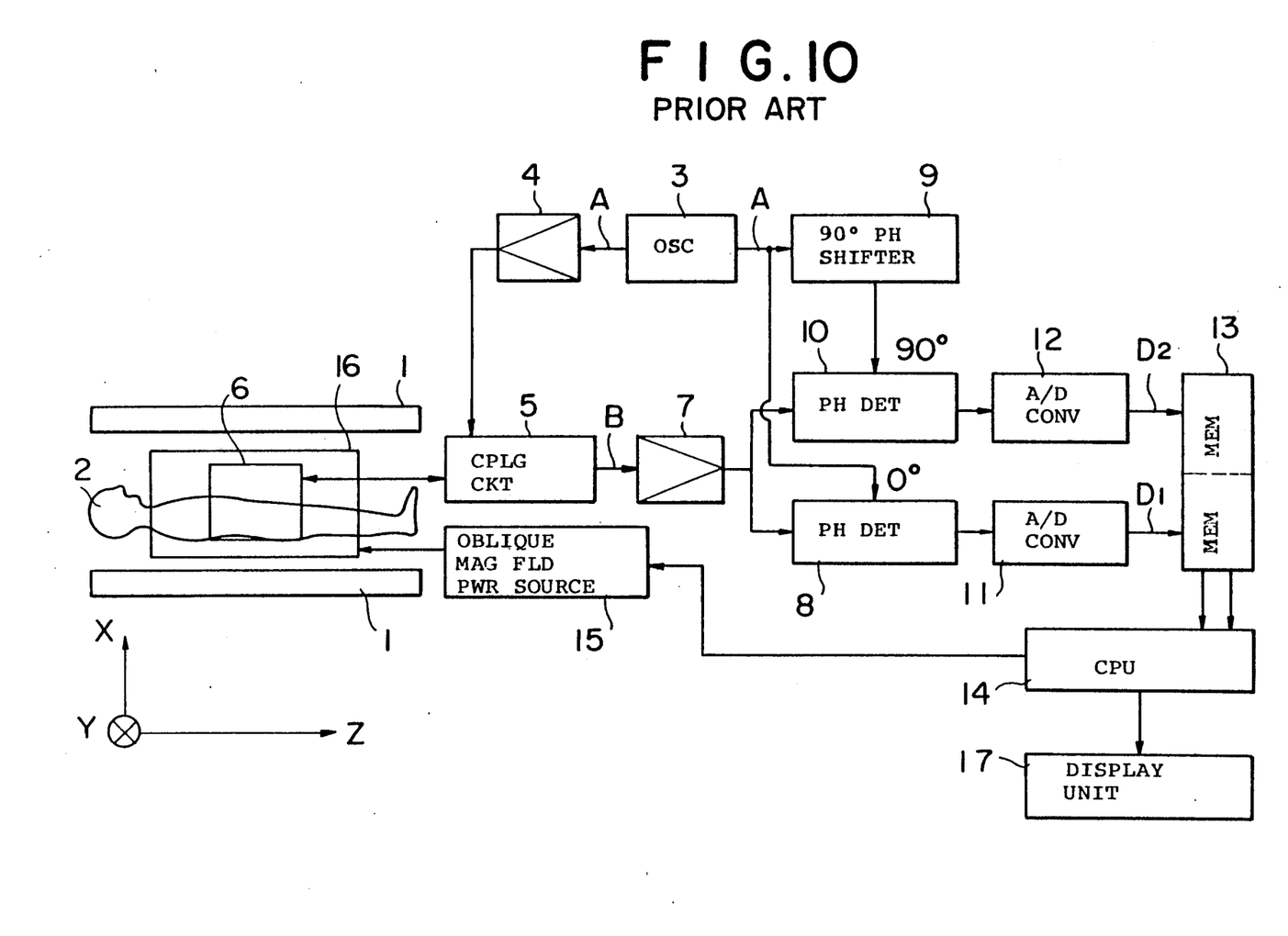
FIG. 10 is a block diagram showing a conventional signal producing system.

FIG. 10 is a block diagram showing a conventional signal producing system, for example, applied to a magnetic resonance apparatus. In FIG. 10, a body 2 to be examined is disposed in a magnet 1 for generating a static magnetic field in a direction Z.

A gate modulation amplifier 4 for amplifying a radio frequency (RF) wave A as a pulse is connected to an oscillator 3 for generating the RF wave A, a transmission/reception switching coupling circuit 5 is connected to the gate modulation amplifier 4, an RF coil 6 disposed in the magnet 1 is connected to the coupling circuit 5, an amplifier 7, to which a reception signal B from the RF coil 6 is inputted, is connected to the coupling circuit 5, a 0° phase detector 8 and a 90° phase detector 10 are connected to the amplifier 7, a 90° phase shifter 9 is inserted between the oscillator 3 and the phase detector 10, A/D converters 11 and 12 are respectively connected to the phase detectors 8 and 10, a memory 13 is connected to the A/D converters 11 and 12, and a computer 14 having a calculating function for controlling an entire apparatus is connected to the memory 13.

An oblique magnetic field power source 15 is connected to the computer 14, an oblique magnetic field coil 16 disposed in the magnet 1 is connected to the oblique magnetic field power source 15, and a display unit 17 for displaying various types of information is connected to the computer 14.

Next, the operation of a conventional signal producing system shown in FIG. 10 will be described with an example of the case that an NMR signal is produced from the body 2 to be inspected as a reception signal B.

The RF wave A from the oscillator 3 is converted by the gate modulation amplifier 4 to pulses, which is further applied through the coupling circuit 5 to the RF coil 6, and emitted as RF pulses to the body 2 to be inspected. Thus, atomic nuclei in the body 2 to be inspected go into an excited state, and a reception signal B is generated when they return to an original thermal balanced state.

The reception signal B is detected by the RF coil 6, and inputted to the phase detectors 8 and 10 through the coupling circuit 5 and the amplifier 7. At this time, since the phase detector 8 uses the RF wave A as it is as a detecting reference signal and the phase detector 10 uses the RF wave A in which its phase is displaced by 90° through the phase shifter 9, the reception signal B is quadrature-detected.

Then, the reception signal B is sampled by A/D converters 11 and 12 at a predetermined sampling frequency fs corresponding to a necessary frequency band, and stored as digital data $D_1$ and $D_2$ in the memory 13.

Subsequently, the digital data $D_1$ and $D_2$ are transferred to the computer 14, and analyzed and calculated, for example, by a Fourier conversion method or a maximum entropy method or the like to obtain a signal for producing desired distribution information, such as a frequency spectrum or an image or the like.

When the magnetic resonance apparatus is of an MRI (Magnetic resonance imaging apparatus), in order to two-dimensional Fourier-convert the digital data $D_1$ and $D_2$ of the reception signal B to reconstruct an image, the computer 14 controls the oblique magnetic field power source 15 to generate an oblique magnetic field of a predetermined sequence from the oblique magnetic field coil 16, thereby providing position information of atomic nucleus spin in the reception signal B.

Figure 11:
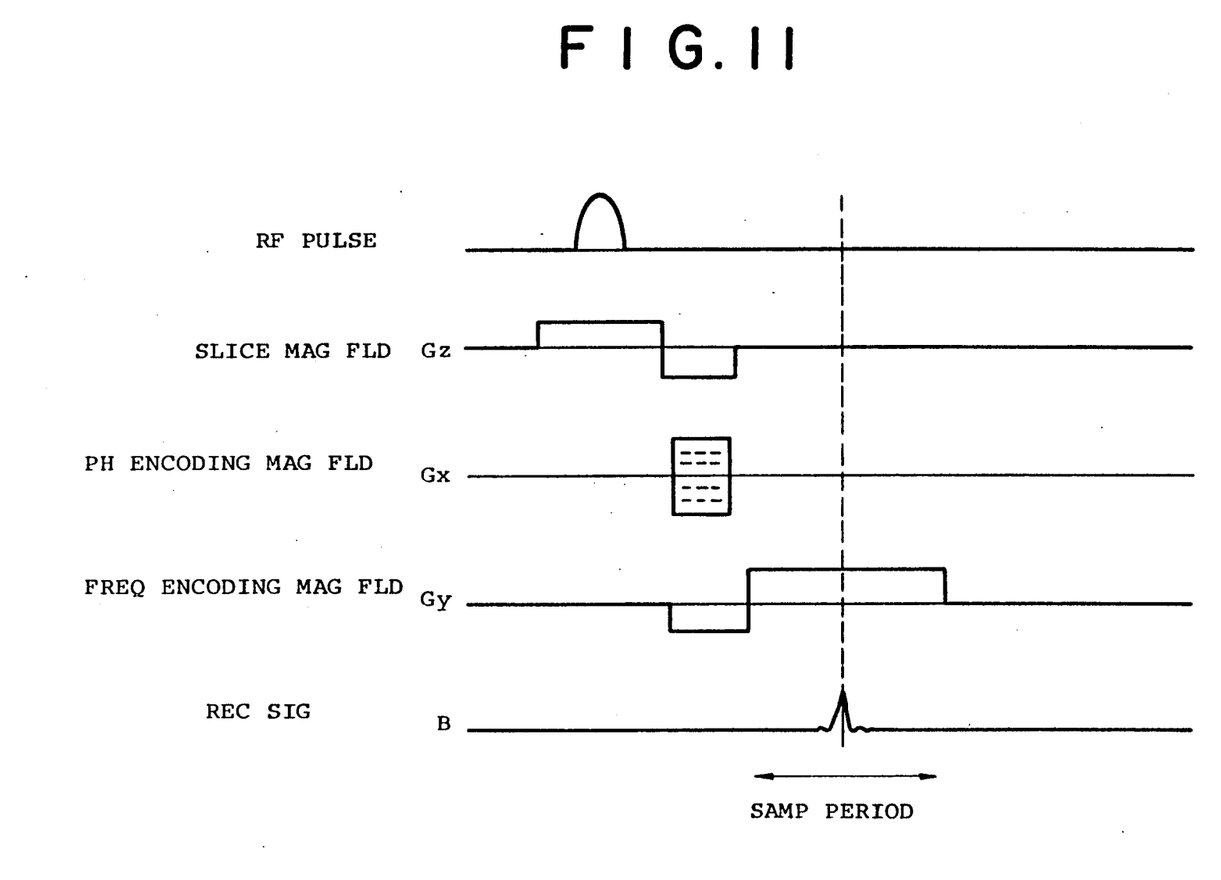
FIG. 11 is a pulse sequence diagram showing a general reception signal (NMR signal) producing method.

FIG. 11 is a pulse sequence diagram for producing a reception signal B used for a Fourier conversion imaging method disclosed, for example, in British Patent No. 2,079,946.

In this case, an RF pulse is of a 90° pulse, of oblique magnetic fields Gx, Gy and Gz of orthogonal 3 axes (X, Y and Z) directions, the Gz is a slice magnetic field, Gx is a phase encoding magnetic field, and Gy is a frequency encoding magnetic field. The Fourier conversion imaging method is described in detail, for example, on pages 54 to 56 of "NMR Medical" (issued by Maruzen Co., Ltd., edited by Nuclear Magnetic Resonance Medical Institute of Technology), and the description will be omitted.

As shown in FIG. 11, the position information of the excited atomic nucleus spin is applied to the reception signal B received during a sampling period by applying the phase encoding magnetic field Gx and the frequency encoding magnetic field Gy. Accordingly, the distribution image of the atomic nucleus spin is reconstructed by the Fourier conversion imaging method in accordance with the signal obtained by Fourier-converting the digital data $D_1$ and $D_2$, and this image is displayed on the display unit 17.

In order to produce a magnetic resonance image having $N \times M$ pixels by the Fourier conversion imaging method, it is necessary to systematically vary the phase encoding magnetic field Gx N times (refer to a broken line), and to sample N types of reception signals B by the A/D converters 11 and 12 N times. Then, the obtained $N \times N$ data (u, v) are two-dimensional Fourier-reverse converted to produce images f (x, y), where u corresponds to a phase encoding direction, v corresponds to a time sampling direction, $u = 1, 2, \ldots, N$, and $v = 1, 2n, \ldots, N$. Here, a reception signal row obtained by Fourier-converting the digital data $D_1$ and $D_2$ is represented by the spatial frequency expression (from the result that the image is two-dimensional Fourier-converted) of the magnetic resonance image.

Generally, it is understood as described, for example, in "The Television Society Journal" (No. 8, Vol 37, in 1983) that the spatial frequency components of the image is concentrated to low frequency components. Accordingly, an energy is mostly concentrated at the d.c. component of the spatial frequency, and reduced exponentially toward high frequencies. The actually obtained reception signal B indicates a similar trend to this.

Figure 12A:
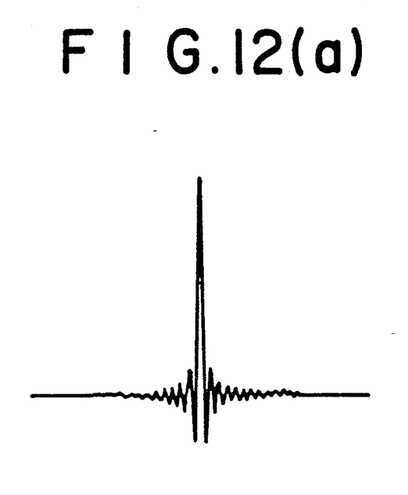
FIGS. 12(a) and 12(b) are waveform diagrams showing digital data of an ideal reception signal (NMR signal)
Figure 12B:
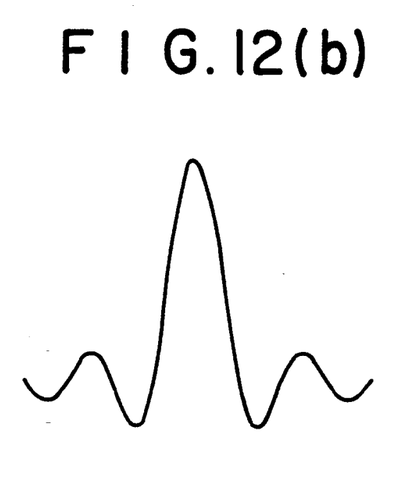
Figure 13:
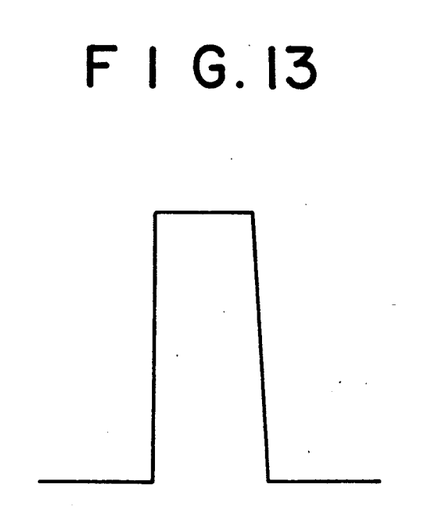
FIG. 13 is a waveform diagram showing a signal after the waveform of FIG. 12 is Fourier-converter.

FIGS. 12(a) and 12(b) show ideal waveforms of one line passing the d.c. component of the reception signal B (when the phase encoding magnetic field Gx is zero), wherein FIG. 12(b) is a waveform diagram showing the enlarged central portion of the waveform in FIG. 12(a) enlarged in a time base (lateral) axis direction, corresponding, for example, to the digital data $D_1$ and $D_2$ of a point N (=256) when the quantizing errors of the A/D converters 11 and 12 are not presented. FIG. 13 is a waveform diagram of a signal obtained by one-dimensional Fourier-converting the length of the sampling point number N for the digital data $D_1$ and $D_2$. In this case, its signal waveform becomes ideal rectangular, the central part of the rectangular portion corresponds to a d.c. frequency, the both sides of the central part correspond to low frequencies, and the parts separated from the central part correspond to high frequencies. The Fourier conversion is of complex Fourier conversion, the waveform of a complex number section similarly exists, but only a real number section will be described for the simplification of the description.

Figure 14A:
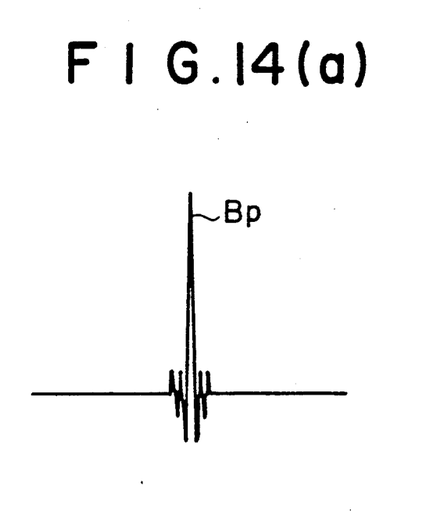
FIGS. 14(a) and 14(b) are waveform diagrams showing the digital data of a reception signal (NMR signal) obtained by a conventional system.
Figure 14B:
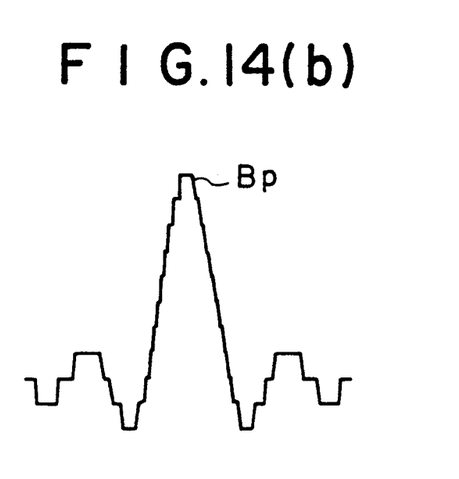

FIGS. 14(a) and 14(b) are waveform diagrams of the digital data $D_1$ and $D_2$ obtained actually corresponding to FIGS. 12(a) and 12(b), illustrating the case that the effective bit number corresponding to its amplitude is 4 bits.

In this case, the A/D converters 11 and 12 are so set that the maximum value of the reception signal B become the maximum value of the digital data $D_1$ and $D_2$ so as not to overflow at the time of A/D conversion. Accordingly, the peak signal Bp of the central part is converted as the maximum data of the A/D converters 11 and 12, and the small amplitude components on the both sides of the peak signal Bp are buried in the (quantizing error) range of the quantizing step to lose information.

Figure 15:
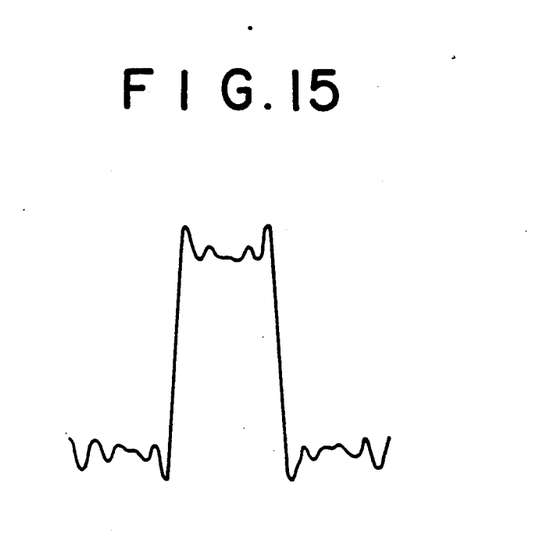
FIG. 15 is a waveform diagram showing a signal after the waveform of FIG. 14 is Fourier-converted.

As described above, the result that the digital data $D_1$ and $D_2$ in which information of high frequency components are lost are Fourier-converted becomes as shown in FIG. 15, the rise and fall of the rectangular portion become obtuse as compared with the ideal waveform (FIG. 13), and a noise due to the quantizing error is generated.

When the magnetic resonance apparatus is not the MRI but a spectroscopy for producing a frequency spectrum, its reception signal B is equal to a one-dimensional signal on a line passing a d.c. component of the signal obtained by a Fourier conversion imaging method. In this case, the digital data $D_1$ and $D_2$ are, for example, one-dimensional or two-dimensional Fourier-converted as they are.

As mentioned above, when the reception signal B is of the NMR signal, the image constitution or frequency spectral analysis can be performed in accordance with the reception signal B.

Then, a signal processing method for directly producing a spin-spin moderating time $T_2^*$ from the time component data of a reception signal B will be described with an example of the case that the reception signal B is of an FID (free induction damping) signal.

In this case, in the pulse sequence in FIG. 11, the oblique magnetic fields Gz, Gx and Gy are not applied at all, but an FID signal immediately after the 90° RF pulse is applied is received as a reception signal B.

Figure 16:
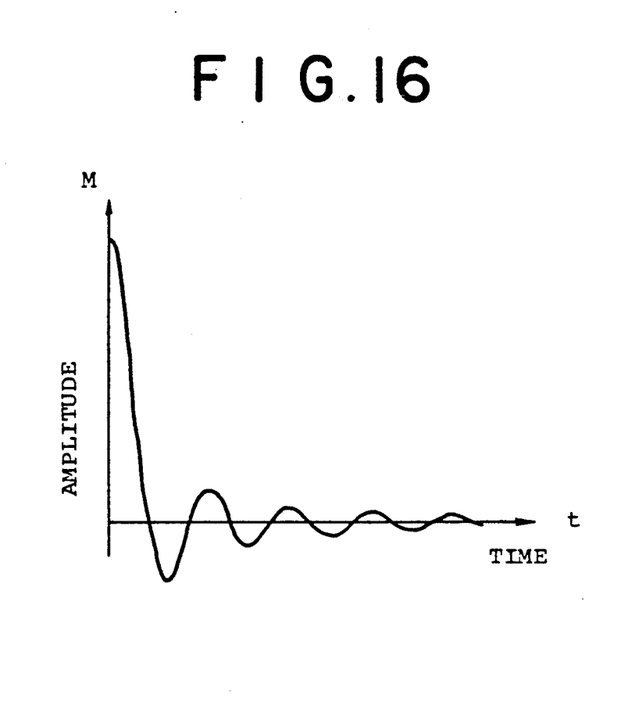
FIG. 16 is a waveform diagram showing the digital data of an ideal reception signal (FID signal)

FIG. 16 is a waveform diagram of digital data $D_1$ and $D_2$ of a reception signal B, for example, at N (=256) points when the quantizing errors of the A/D converters 11 and 12 are not presented. In this case, since the reception signal B is not received during the application of the RF pulses, it becomes a waveform received from an initial amplitude M.

Figure 17:
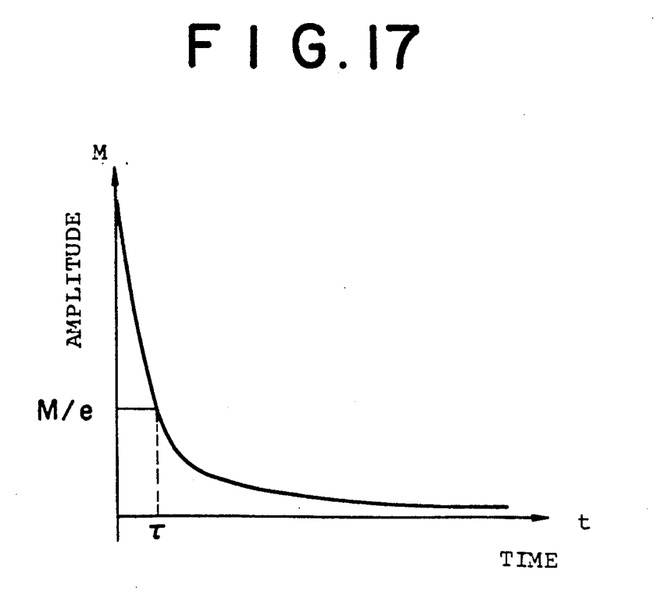
FIG. 17 is a waveform diagram showing the envelope of the waveform of FIG. 16.

FIG. 17 shows an ideal envelope obtained from the waveform in FIG. 16, and the spin-spin moderating time $T_2^*$ of a body 2 to be inspected is obtained as a time x until the initial amplitude M is attenuated to (1/e).

Figure 18:
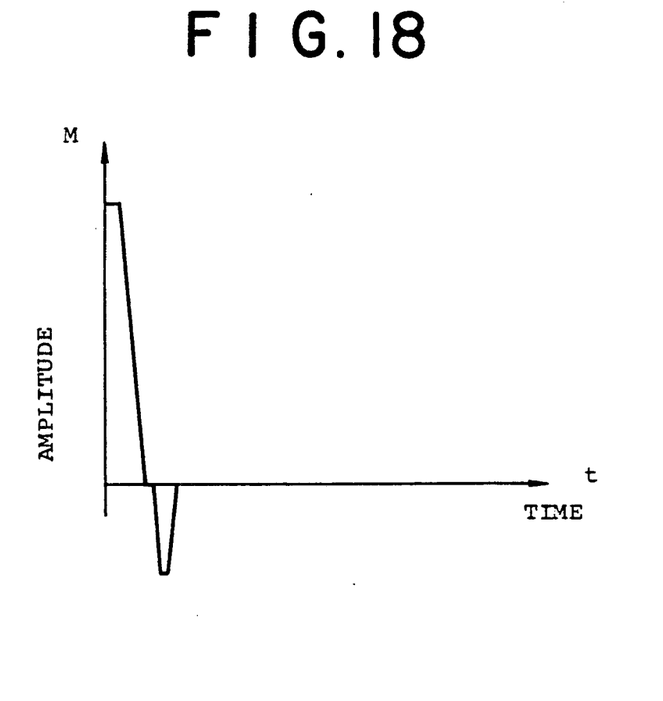
FIG. 18 is a waveform diagram showing the digital data of a reception signal (FID signal) produced by a conventional system.

FIG. 18 is a waveform diagram of digital data $D_1$ and $D_2$ obtained actually corresponding to FIG. 16, illustrating the case that the effective bit number corresponding to the maximum initial amplitude M is 4 bits similarly to the above description. In this case, the data of the small amplitude is also buried in the quantizing error.

Figure 19:
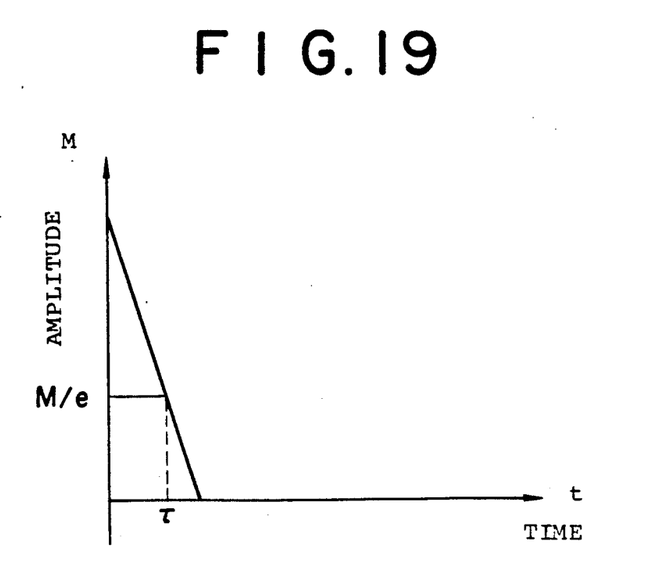
FIG. 19 is a waveform diagram showing the envelope of the waveform of FIG. 18.

Therefore, the envelope obtained from the waveform in FIG. 18 becomes as shown in FIG. 19, and it is understood that the error of the spin-spin moderating time $T_2^*$ obtained from $\rho = T_2^*$ is large.

Since the conventional signal producing system so converts in the A/D converters 11 and 12 that the maximum value of the reception signal B become the maximum value of the digital data $D_1$ and $D_2$ as described above, most reception signals B are buried in the quantizing error of the A/D converters 11 and 12 and not detected, and the system has a problem that the resolution of the frequency spectral analysis or the timing information producing accuracy is deteriorated.

SUMMARY OF THE INVENTION

The present invention has been made to solve the above-described problems, and has for its object to provide an electric signal producing system which can detect a reception signal having a small amplitude to improve the resolution of its frequency spectral analysis and the producing accuracy of timing information.

An electric signal producing system according to the present invention comprises known signal generating means for generating a known signal having a predetermined frequency, adding means for adding the known signal to a reception signal to generate a mixture signal, an A/D converter for converting the mixture signal to digital data, and a computer for controlling the A/D converter to oversample the mixture signal by a frequency of twice or more as large as a predetermined sampling frequency and calculating in accordance with the digital data.

A first signal producing method in the present invention comprises the step of adding a known signal having a predetermined frequency to a reception signal to obtain a mixture signal, and the step of oversampling the mixture signal at a frequency of twice or more the frequency of a predetermined sampling frequency to obtain digital data.

A second signal producing method in the present invention comprises the step of further converting the digital data to a frequency spectrum in the first signal producing method.

A third signal producing method in the present invention comprises the step of further processing with a digital filter the digital data in the first signal producing method.

In the present invention, the level of the reception signal having a small amplitude is raised by adding the known signal thereto, and the reception signal having a small amplitude corresponding to a high frequency component can be detected in high resolution.

Further, in the present invention, the frequency spectral analysis is conducted with high accuracy.

In the present invention, timing information can be accurately obtained by the digital data processing.

BRIEF DESCRIPTION OF THE DRAWINGS

In the drawings, the same symbols indicate the same or corresponding parts.

DESCRIPTION OF THE PREFERRED EMBODIMENTS

Figure 1:
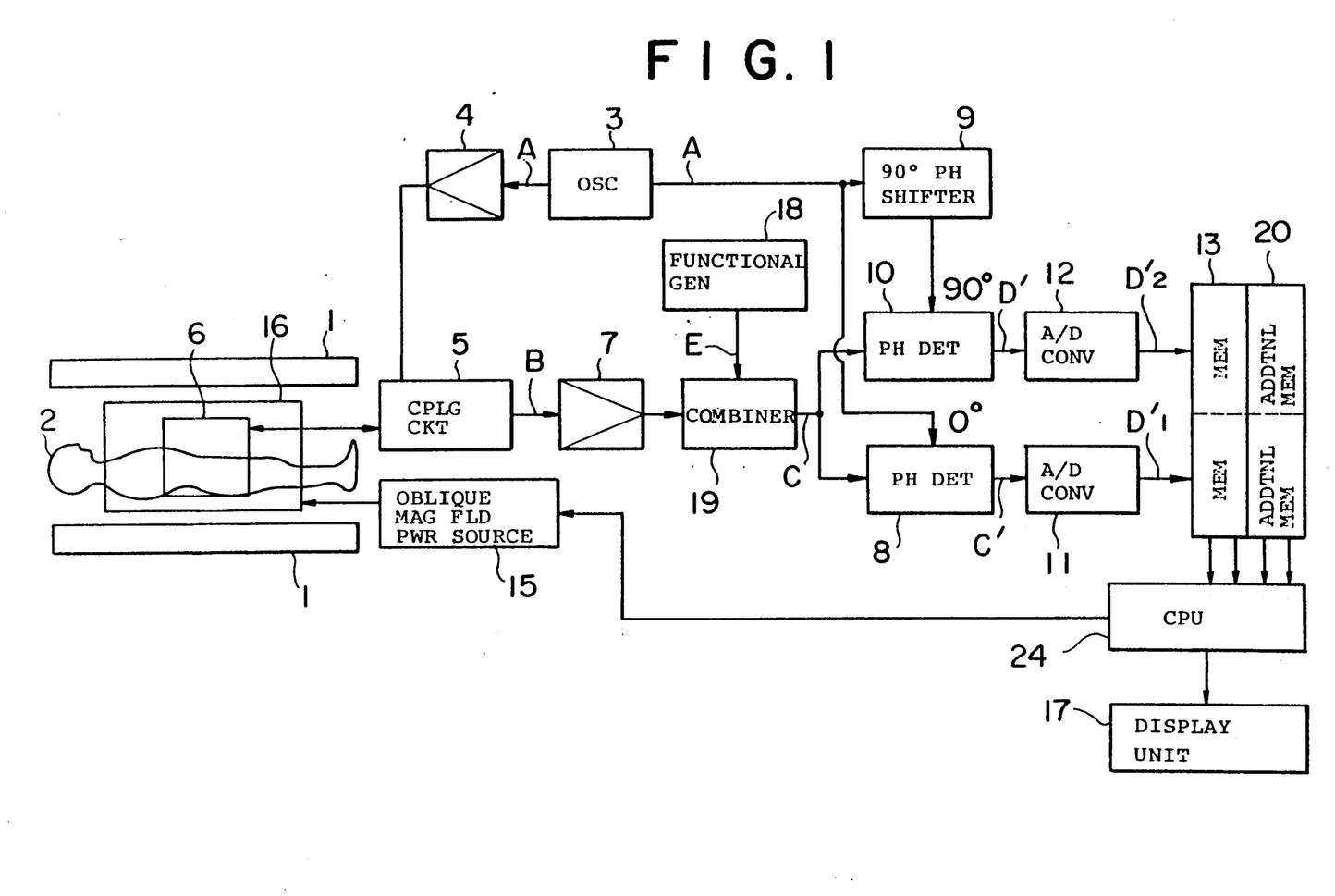
FIG. 1 is a block diagram showing an embodiment of an electric signal producing system according to the present invention.

An embodiment of the present invention will be described below in conjunction with the drawings. FIG. 1 is a block diagram showing an embodiment of a magnetic resonance apparatus, i.e., and electric signal producing system according to the present invention, wherein the reference numerals 1 to 13 and 15 to 17 correspond to those as described above.

A function generator 18 as known signal generating means generates a known signal E having a predetermined frequency. A combiner 19 as adding means adds the known signal E to a reception signal B to generate a mixture signal C.

An additional memory 20 provided in parallel with a memory 13 stores digital data $D_1'$ and $D_2'$ oversampled by A/D converters 11 and 12.

A computer 14 for controlling an entire apparatus which comprises the functional generator 18, the combiner 19 and the additional memory 20 instructs an oversampling for the A/D converters 11 and 12, and calculates as predetermined in accordance with the digital data $D_1'$ and $D_2'$.

The embodiment of the present invention will be described with an example of the case that an image is constituted in accordance with an NMR signal similarly to the above description.

Figure 2:
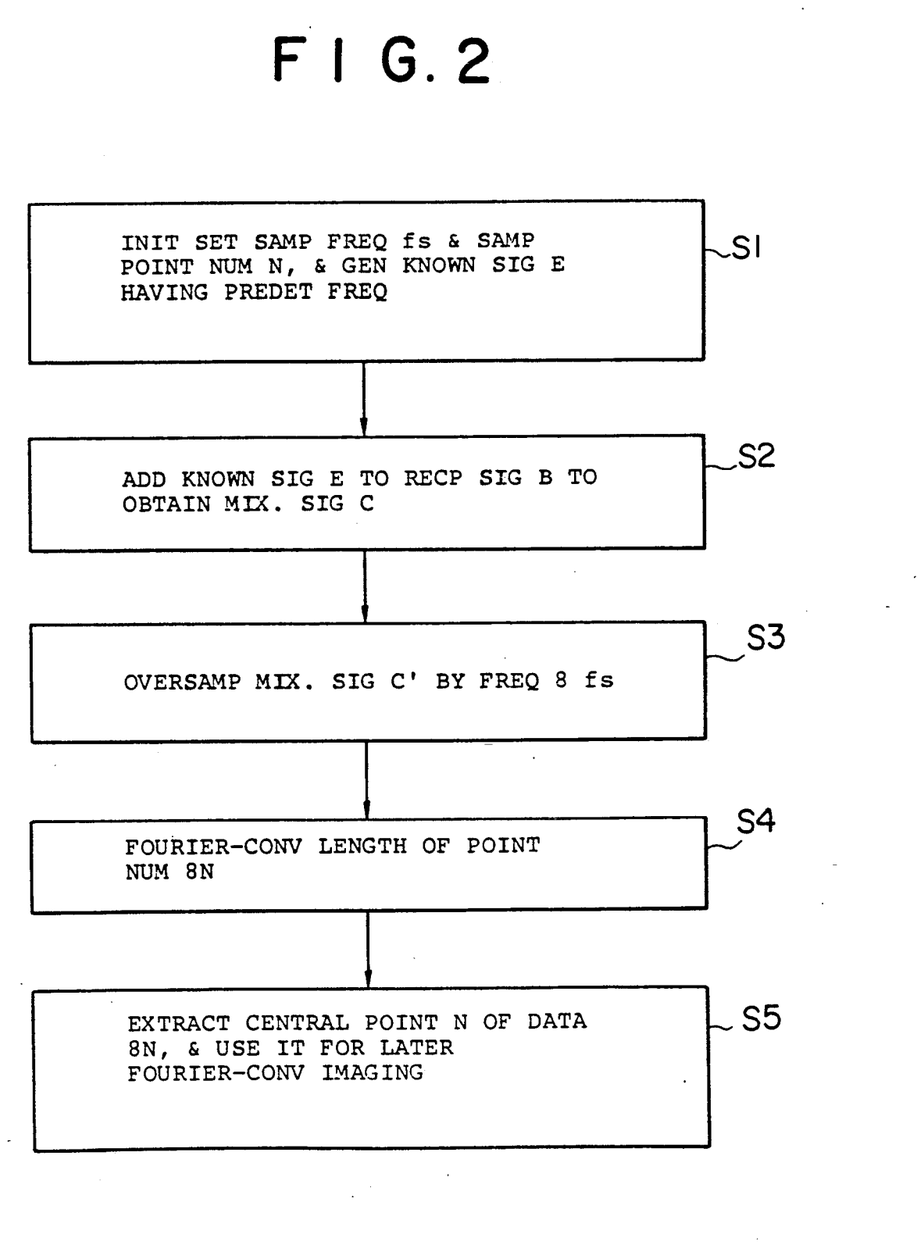
FIG. 2 is a flow chart showing first and second signal producing methods according to the present invention.
Figure 3:
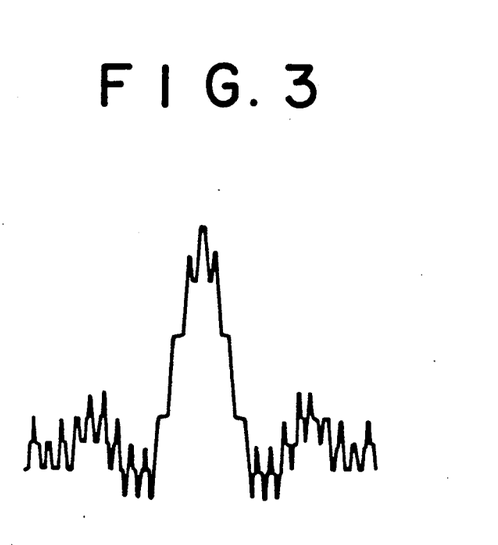
FIG. 3 is a waveform diagram showing digital data of a reception signal (NMR signal) obtained by the first signal producing method of the present invention.
Figure 4:
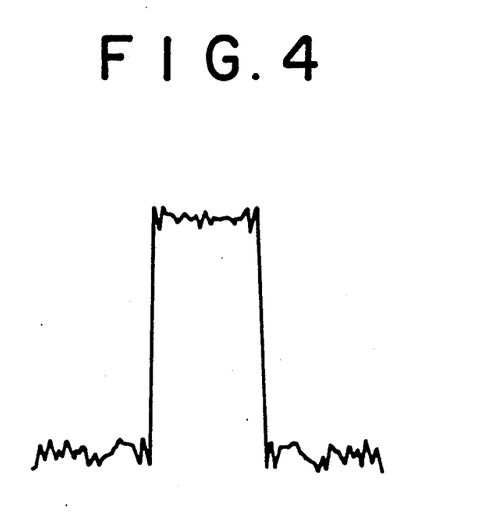
FIG. 4 is a waveform diagram showing a signal after the waveform in FIG. 3 is Fourier-converted.

FIG. 2 is a flow chart for explaining an embodiment of an electric signal producing system according to the present invention. FIGS. 3 and 4 are waveform diagrams showing the digital data of a reception signal (NMR signal) obtained by the system in FIG. 1 and a signal after Fourier conversion, respectively corresponding to FIGS. 12(b) and 13. A pulse sequence for producing the reception signal B is as shown in FIG. 11.

Normal sampling conditions, i.e., a predetermined sampling frequency fs and a sampling point number N corresponding to a necessary frequency band are initially set in the computer 24, and a known signal E, namely, a sine wave having predetermined frequency is generated from the functional generator 18 (in step S1).

Here, the frequency of the known signal E corresponds to the sum of the frequency of an RF wave A and the normal sampling frequency fs, and its amplitude corresponds to the quantizing level width of the A/D converters 11 and 12.

The known signal E is added to the reception signal B by the combiner 19 to obtain a mixture signal C, which is further detected by phase detectors 8 and 10 to obtain a mixture signal C' (in step S2). At this time, the frequency of the known signal E' contained in the mixture signal C' after the detection coincides with the normal sampling frequency fs since the frequency of the RF wave A is removed from the frequency of the known signal E before the detection.

Then, the mixture signal C' is oversampled by the A/D converters 11 and 12 in accordance with an oversampling command from the computer 24 (in step S3). In this embodiment, the oversampling frequency is, for example, set to a frequency 8fs which is 8 times larger than the predetermined sampling frequency fs, and the sampling point number is 8N (=2048).

The digital data $D_1'$ and $D_2'$ obtained as described above contain the known signal E' having a frequency equal to the sampling frequency fs. Accordingly, the signal having a small amplitude contained in the reception signal B is positively detected according to the sine function of the known signal E', and stored as the digital data $D_1'$ and $D_2'$ in the memory 13 and the additional memory 20.

Subsequently, the computer 24 fetches the digital data $D_1'$ and $D_2'$ from the memory 13 and the additional memory 20, and one-dimensional Fourier-converts the length of the sampling point number 8N (in step S4) to extract only the N (=256) points of a central part (d.c. component and low frequency components) actually required, thereby obtaining a signal waveform as shown in FIG. 4.

In the waveform in FIG. 4, the rise and the fall of its rectangular portion become acute as apparent as compared with the conventional waveform of FIG. 15, since small amplitude information corresponding to the high frequency components contributes to the Fourier conversion. Further, since the frequency (=fs) of the known signal E' is set to a sufficiently high value, it does not affect the influence to the waveform of the central part of the waveform after the Fourier conversion.

As described above, the signals Fourier-converted in one line direction (FIG. 4) are produced by varying N times the phase encoding magnetic field Gx (FIG. 11), then longitudinally Fourier-converted to be used for Fourier conversion imaging (in step S5). Thus, a two-dimensional image having N×N pixels and high resolution can be reconstructed.

Similarly, the signal processing of high resolution can be also performed in the case that the magnetic resonance apparatus is of a spectroscopy. In both cases, the processing can be carried out by simply altering the program in the computer 24 to eliminate an increase in its cost.

The above embodiment has been described with respect to the case that the magnetic resonance apparatus is used as an example of the electric signal producing system and the reception signal B is processed by the Fourier conversion method or the maximum entropy method. However, the present invention can also be applied to the other reception signal B produced for the purpose of its spectral analysis.

Next, another embodiment of the present invention for directly producing timing information from the digital data $D_1'$ and $D_2'$ by obtaining an FID signal as a reception signal B without applying oblique magnetic fields Gx to Gz will be described with reference to the pulse sequence diagram of FIG. 11. In this case, a digital filter processing function is added to the computer 24 in FIG. 1.

Figure 5:
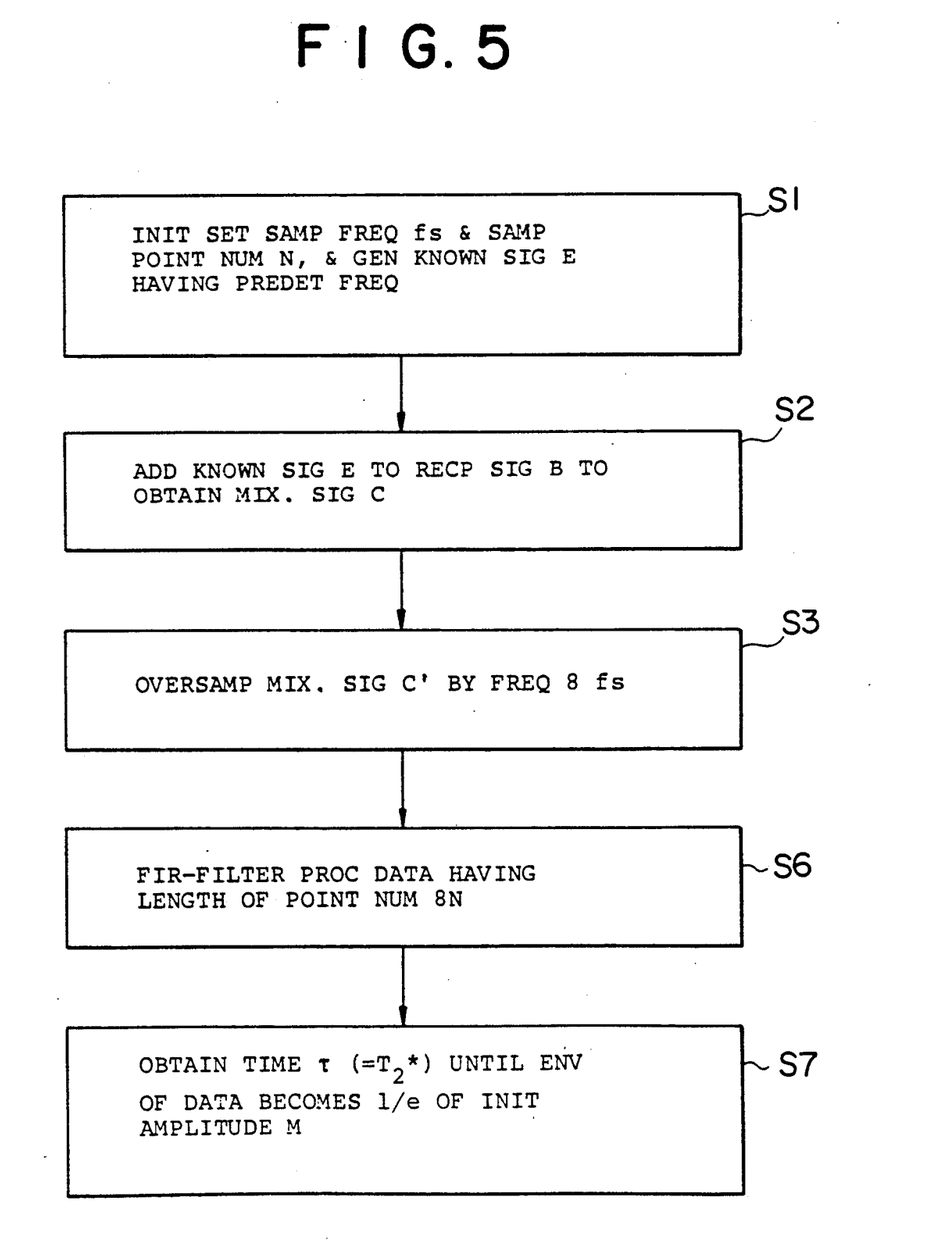
FIG. 5 is a flow chart showing an embodiment of a third signal producing method according to the present invention.

FIG. 5 is a flow chart showing a signal producing method according to another embodiment of the present invention to obtain a spin-spin moderating time $T_2^*$.

Figure 6:
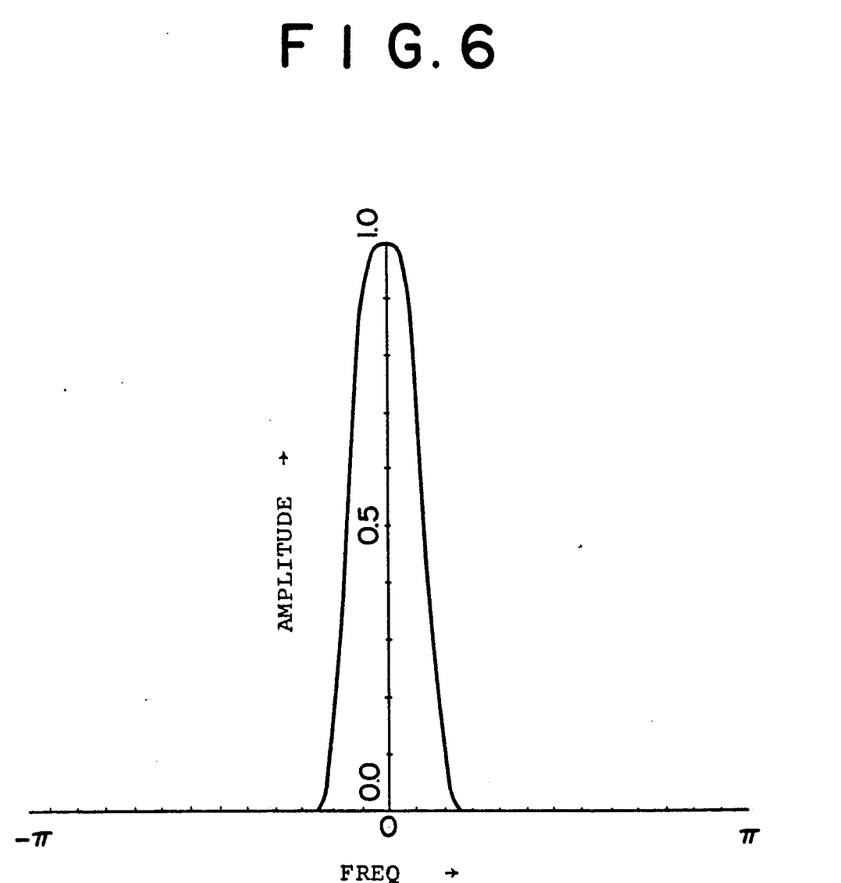
FIG. 6 is an explanatory view showing the frequency characteristic of an FIR filter used for the third signal producing method according to the present invention.

FIG. 6 is a frequency characteristic diagram of an FIR means (finite impulse response) filter used as digital filter processing means (low pass filter) in the computer 14, wherein its abscissa axis indicates a frequency, and its ordinate axis indicates an amplitude.

Here, the length (coefficient) of the impulse response on the time base of the FIR filter is set, for example, to 35 as the following H(1) to H(35).

$H(1) = H(35) \approx -1.23 \times 10^{-3}$ $H(2) = H(34) \approx -2.31 \times 10^{-3}$ $H(3) = H(33) \approx -3.99 \times 10^{-3}$ $H(4) = H(32) \approx -5.90 \times 10^{-3}$ $H(5) = H(31) \approx -7.62 \times 10^{-3}$ $H(6) = H(30) \approx -8.56 \times 10^{-3}$ $H(7) = H(29) \approx -7.96 \times 10^{-3}$ $H(8) = H(28) \approx -5.08 \times 10^{-3}$ $H(9) = H(27) \approx 7.33 \times 10^{-4}$ $H(10) = H(26) \approx 9.83 \times 10^{-3}$ $H(11) = H(25) \approx 2.22 \times 10^{-2}$ $H(12) = H(24) \approx 3.72 \times 10^{-2}$ $H(13) = H(23) \approx 5.39 \times 10^{-2}$ $H(14) = H(22) \approx 7.10 \times 10^{-2}$ $H(15) = H(21) \approx 8.56 \times 10^{-2}$ $H(16) = H(20) \approx 9.91 \times 10^{-2}$ $H(17) = H(19) \approx -1.07 \times 10^{-1}$ $H(18) \approx 1.10 \times 10^{-1}$ When the above coefficients H(1) to H(35) are Fourier-converted on the time base, a frequency characteristic as a low pass filter as shown in FIG. 6 is obtained.

Figure 7:
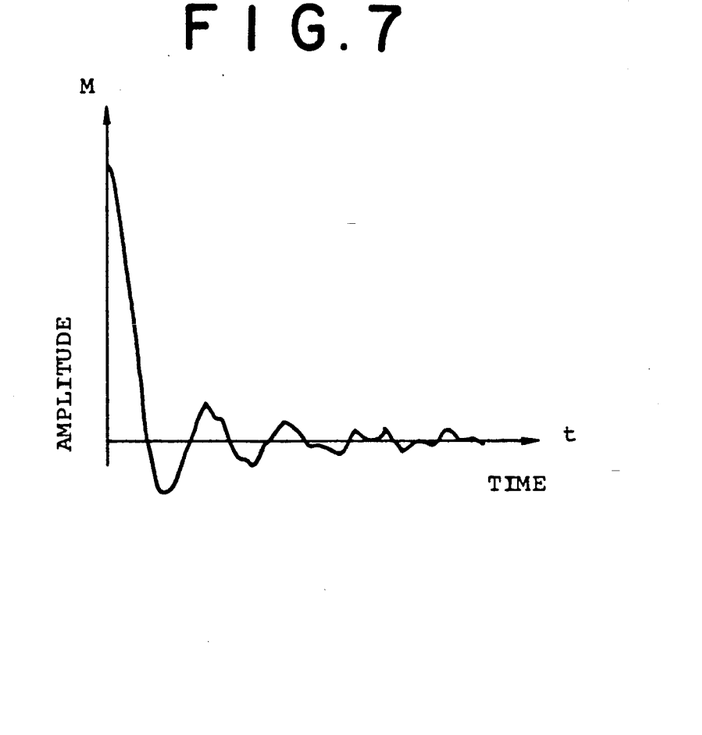
FIG. 7 is a waveform diagram showing the digital data of a reception signal (FID signal) obtained by the digital filter processing of FIG. 6.
Figure 8:
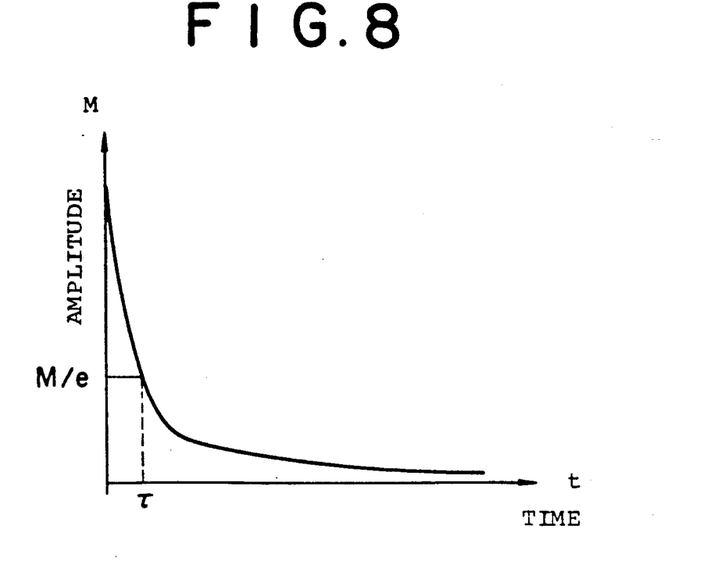
FIG. 8 is a waveform diagram showing an envelope of the waveform of FIG. 7.

FIG. 7 is a waveform after the digital data $D_1'$ and $D_2'$ of the reception signal B (FID signal) are digital filter-processed by the FIR filter of FIG. 6, FIG. 8 shows the envelope of FIG. 7, and FIGS. 7 and 8 correspond to FIGS. 16 and 17 described above.

In FIG. 5, the processes from the initial setting step S1 to the oversampling step S3 are as described above, and the description will be omitted.

The computer 24 fetches the digital data $D_1'$ and $D_2'$ stored in the memory 13 and the additional memory 20, and executes the digital filter processing with the FIR filter for the data having the length of sampling point number 8N (in step S6).

The digital filter processing accurately executes a convolution calculation in accordance with the digital data $D_1'$ and $D_2'$ obtained in high resolution. Since the FIR filter removes the frequencies except the d.c. and the low frequencies as shown in FIG. 6, the known signal E' set to sufficiently high frequency (e.g., the sampling frequency fs) are removed, and the waveforms of the digital data $D_1'$ and $D_2'$ approximate to the ideal waveform (FIG. 16) are obtained as shown in FIG. 7.

Therefore, the envelope of the waveform of FIG. 7 becomes a waveform similar to the ideal waveform (FIG. 17) as shown in FIG. 8.

Eventually, the time $\tau$ until it becomes (1/e) of the initial amplitude M is obtained as the spin-spin moderating time $T_2^*$ (=$\tau$) (in step S7). At this time, since the error of the timing data contained in the waveform of the envelope is less, the spin-spin moderating time $T_2^*$ is accurately obtained.

The impulse response coefficient of the FIR filter used here is not limited to 35, but may be another value, and anther digital filter or band pass filter may be used if it can remove the frequency of the known signal E'.

The FID signal is used as the reception signal B. However, another reception signal B for handling timing information similarly to the above by converting to the digital data $D_1'$ and $D_2'$ may be applied.

In the step S6 of FIG. 5, the FIR filter output having the length of 8N is obtained similarly from the digital data input having the length of the sampling point number 8N. However, before the envelope is obtained, the FIR filter output may be extracted to $\frac{1}{8}$. In this case, the number of the data to be handled may be alleviated to $\frac{1}{8}$.

Further, the data having the length N after the extraction may be Fourier-converted and frequency spectral-analyzed.

Figure 9:
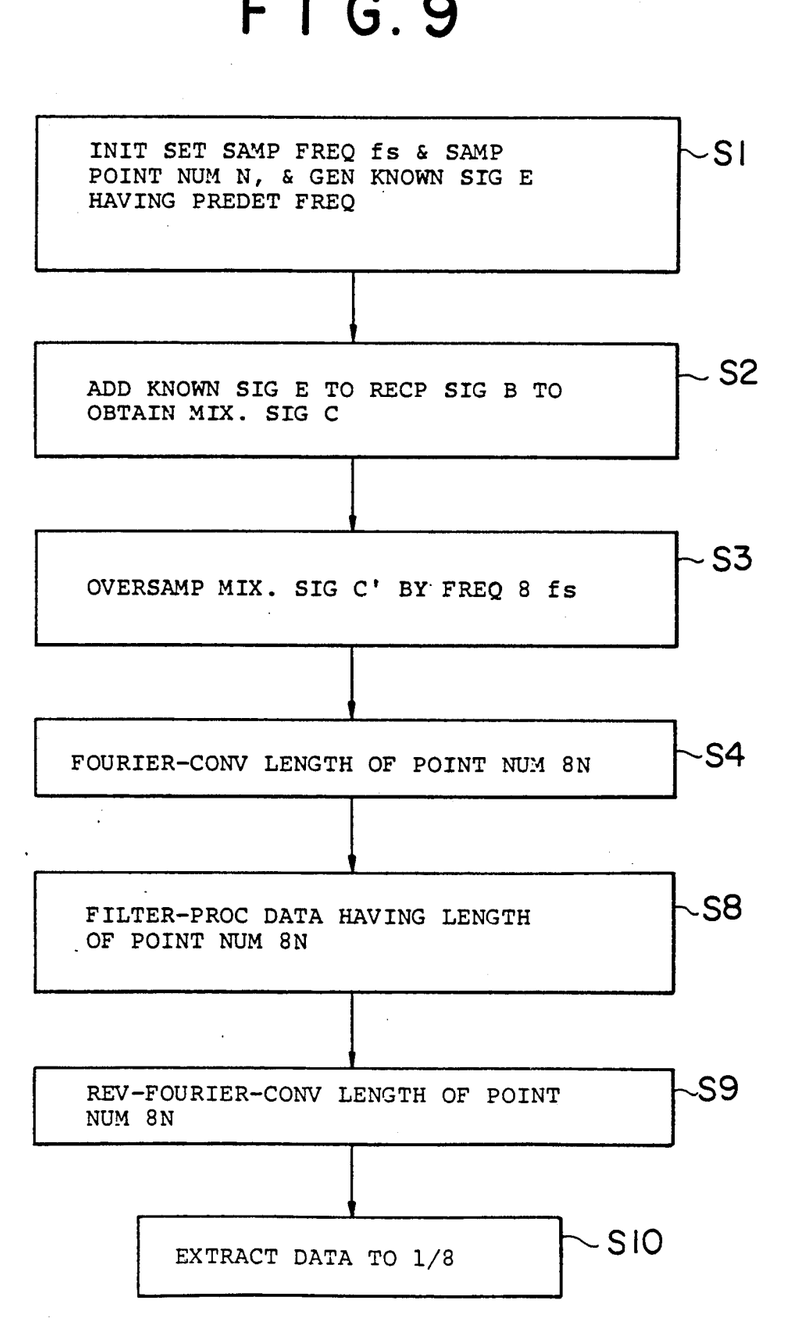
FIG. 9 is a flow chart showing the third signal producing method according to the present invention.

Further, as shown in FIG. 9, the data having the length of sampling point number N is digital filter-processed (in step S8) after the data having the length of the sampling point number 8N is Fourier-converted in step S4, the data having the length of the sampling point number 8N is reverse-Fourier-converted (in step S9), and further the data number may be extracted to $\frac{1}{8}$ in step S10.

In this case, since the digital filter processing step S8 is conducted in the frequency band and the timing information is accurately reproduced by the reverse Fourier converting step S9, it is not limited to the spin-spin moderating time $T_2^*$, but other timing information can be accurately obtained.

In the embodiments described above, the sine wave is used as the known signal E (E') having a predetermined frequency. However, a triangular wave or a sawtooth wave may be used to provide the equivalent advantages.

In the embodiments described above, the frequency of the known signal E coincides with the sum of that of the RF wave and the sampling frequency fs. However, another value may be used if the frequency does not deform the signal to be eventually obtained.

In the embodiments described above, the amplitude of the known signal E (E') coincides with the step width of the quantizing level. However, it is not necessary for them to severely coincide.

In the embodiments described above, the functional generator 18 is used as the known signal generating means. However, a frequency divider, a frequency multiplier or a mixer (not shown) connected to the oscillator 3 may be used.

In the embodiments described above, the combiner 19 for magnetically coupling is used as the adding means. However, another type of adder for capacitively coupling may be used.

In the embodiments described above, the adding means is inserted between the amplifier 7 and the phase detectors 8, 10. However, the adding means may be inserted to the input terminals of the A/D converters 11 and 12. Accordingly, the combiner 19 may be inserted between the phase detectors 8, 10 and the A/D converters 11, 12. In this case, the frequency of the known signal E from the functional generator 18 may coincide with the frequency of the known signal E' after the detection, i.e., the sampling frequency fs.

In the embodiments described above, the frequency for the oversampling in the A/D converters 11 and 12 is set to 8 times as large as the normal sampling frequency fs. However, it may be set to twice or more as large as the sampling frequency fs.

Further, the embodiments have been described with respect to the case that the reception signal B is quadrature-detected. However, the present invention may employ another detecting method.

According to the present invention as described above, the electric signal producing system comprises the known signal generating means for generating a known signal having a predetermined frequency, the adding means for adding the known signal to a reception signal to generate a mixture signal, the A/D converter for converting the mixture signal to digital data, and the computer for controlling the A/D converter to oversample the mixture signal by a frequency of twice or more as large as a predetermined sampling frequency and calculating in accordance with the digital data. Therefore, the reception signal having a small amplitude corresponding to a high frequency component can be detected with high resolution without increasing the number of quantizing effective bits of the A/D converters.

Further, according to the first method of the present invention, the step of adding the known signal having a predetermined frequency to the reception signal to obtain a mixture signal, and the step of oversampling the mixture signal at a frequency of twice or more as large as a predetermined sampling frequency to obtain digital data are provided. Therefore, the reception signal having a small amplitude can be detected in high resolution.

Moreover, according to the second method of the present invention, the step of further converting the digital to a frequency spectrum in the first signal producing method is provided. Therefore, the frequency spectrum can be accurately analyzed.

Further, according to the third method of the present invention, the step of further processing with a digital filter the digital data in the first signal producing method is added. Therefore, the timing information can be obtained accurately.

What is claimed is:

1. An electric signal producing system comprising:
   known signal generating means for generating a known signal having a predetermined frequency chosen so as to correspond to frequency components of a reception signal which are low in amplitude as compared to a maximum amplitude frequency component of said reception signal,
   adding means for adding the known signal to said reception signal to generate a mixture signal,
   an A/D converter for converting said mixture signal to digital data, and
   a computer for controlling said A/D converter to oversample said mixture signal by a frequency of twice or more as large as a Nyquist sampling frequency.

2. The electric signal producing system according to claim 1, wherein said computer controls said adding means as well as said A/D converter.

3. The electric signal producing system according to claim 1, wherein said computer further converts the digital data to a frequency spectrum.

4. The electric signal producing system according to claim 1, wherein said computer further processes the digital data with a digital filter.

5. An electric signal producing system comprising:
   adding a known signal having a predetermined frequency to a reception signal as a mixture signal, said predetermined frequency corresponding to frequency components of said reception signal which are low in amplitude as compared to a maximum amplitude frequency component of said reception signal;
   oversampling said mixture signal by a frequency of twice or more as large as a Nyquist sampling frequency to convert it into digital data; and
   Fourier-converting the digital data.

6. An electric signal producing system comprising:
   known signal generating means for generating a known signal having a predetermined frequency corresponding to frequency components of a reception signal which are low in amplitude as compared to a maximum amplitude frequency component of said reception signal;
   adding means for adding said known signal to said reception signal to generate a mixture signal;
   A/D converter for oversampling said mixture signal by a frequency of twice or more as large as a Nyquist sampling frequency to convert it into digital data; and
   a computer for Fourier-converting said digital data.

* * * * *